United States Patent [19]

Fujimoto

[11] Patent Number: 4,856,151

[45] Date of Patent: Aug. 15, 1989

[54] BOARD SPACER

[75] Inventor: Nobuaki Fujimoto, Okazaki, Japan

[73] Assignee: Kitagawa Industries Company, Ltd., Nagoya, Japan

[21] Appl. No.: 268,277

[22] Filed: Nov. 7, 1988

[30] Foreign Application Priority Data

Nov. 24, 1987 [JP] Japan .............................. 62-178458[U]

[51] Int. Cl.4 .......................... F16B 21/08; F16B 5/06; H05K 7/12
[52] U.S. Cl. ........................................ 24/453; 24/297; 174/138 D; 411/508
[58] Field of Search .................... 174/138 D; 361/412, 361/419, 420; 24/297, 453, 458; 403/167, 252, 405.1, 406.1, 407.1, 408.1; 411/508, 548

[56] References Cited

U.S. PATENT DOCUMENTS

| | | | |
|---|---|---|---|
| 4,527,312 | 7/1985 | Ruehl et al. | 24/453 |
| 4,644,614 | 2/1987 | Mizusawa | 24/453 |
| 4,766,652 | 8/1988 | Sugiura | 24/453 |

Primary Examiner—Laramie E. Askin
Attorney, Agent, or Firm—Oliff & Berridge

[57] ABSTRACT

A device for spacing boards, like printed circuit boards, or a board and a mounting surface, like an electronic device chassis, a fixed distance apart. The device is constructed to interlock with other such devices so that boards mounted with these devices may be stacked. A peg-and-notch coupling provides horizontal stability, while a bottom anchor and top latch secure the lower and upper boards, respectively, providing stable vertical stacking.

5 Claims, 7 Drawing Sheets

FIG. 6A
FIG. 6B
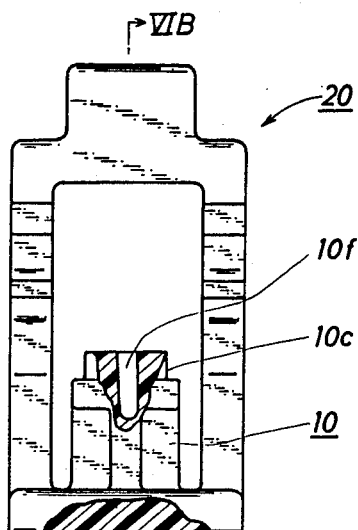
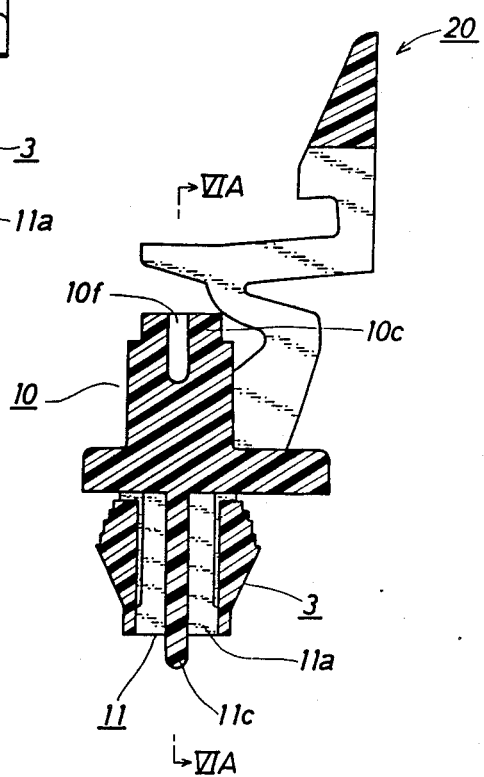

BOARD SPACER

BACKGROUND

1. FIELD

A board spacer for securing two boards, such as printed circuit boards, or a mounting surface and a board, such as an electronic-device chassis and a printed circuit board, a fixed distance apart; and for conveniently stacking boards spaced with other board spacers of this design.

2. PRIOR ART

Traditional board spacers use posts with screws to secure themselves between boards, or between a mounting surface and a board. Screws are usually tedious to use, and are often unusable in the small space typically available in electronic devices. The board spacer 101 in U.S. Pat. No. 4,527,312, shown in FIG. 7, addresses this problem. The spacer 101 has an upper part 103 and a lower part 102, interconnected by a hinge 104. The lower part 102 has a resilient base 105 and anchor 106 between which a board may be secured. The upper part 103 has a latch 107 for latching onto and thus securing a board.

The anchor 106 and latch 107 are positioned to hold the mounted boards a fixed distance apart. The latch 107 includes a handle 108 at its upper end to aid the user in engaging and detaching the boards. The handle 108 includes a slope 109 to ease insertion and removal of a board. The upper part 103 has an insertion guide 110 on its upper surface and a recess 111 for receiving the anchor 106 of another board spacer 101. The embodiment shown in FIG. 7 enables the board spacer 101 to couple with like spacers to secure a number of boards 112a, 112b, 112c & 112d a fixed distance apart.

This spacer 101 is easy to install, but difficult to remove. As indicated in FIG. 7, because the hinge 104 is resilient, to disengage a spacer 101 the user must simultaneously: pull on the handle 108, prevent the hinge 104 from bending by holding the board (in this example 112b) down, and remove the board 112b by lifting from the spacer 101. This awkwardness makes the spacer 101 tedious to use. Moreover, the resiliency of the hinge 104 makes the spacer 101 vertically unstable allowing stacked boards 112a–d to bounce during transportation.

A spacer 101 is stacked by inserting its anchor 106 into the recess 111 in another such spacer 101. The resiliency of the anchor 106 allows the spacer to rock horizontally in the recess 111 on the lower spacer 101 making the coupling horizontally unstable. This squeezes the anchor 106, which can allow the spacers 101 to uncouple. The boards 112a–d may be damaged by this bouncing, rocking, and uncoupling during transportation.

SUMMARY

This invention has a base with an anchor for securing a first board to the underside of the base, struts rising from the base with a spring bar on each strut, a latch with a handle spanning between the spring bars, a sloped face on the latch for easy board insertion, a tip on each spring bar to aid in removal of a board, and a peg on the upper surface of the base. The anchor has a notch for retaining the peg of another spacer so the spacers can be used to stack boards.

The anchor of one spacer is inserted into a mounting hole near an edge of the first board. A second spacer is mounted on a second board the same way. The edge of the second board is pushed against the sloping face of the latch on the first spacer and past the latch hooks so the second board is locked into place. Simultaneously, the peg of one spacer enters the notch of the other spacer, thus locking the spacers together. In this way, boards may be stacked using the spacers as links. To detach a board from the stack, simply pull the handle of a latch holding the board in place. The latch bends clear of the board while the tip pushes the board up, which uncouples the peg-and-notch coupling.

With this device, the boards are spaced equally apart with minimal rocking and bouncing, thus reducing damage. The peg-and-notch coupling is more secure, preventing rocking. Eliminating the hinge also eliminates bouncing. Moreover, this design simplifies use by making engaging and detaching the boards and spacers easier.

DESCRIPTION OF THE DRAWINGS

FIG. 6A is a front partial cross section of the second embodiment along line VIA—VIA in FIG. 6B.
FIG. 6B is a side cross section of the second embodiment along line VIB—VIB in FIG. 6A.

EMBODIMENT

Figure 1:
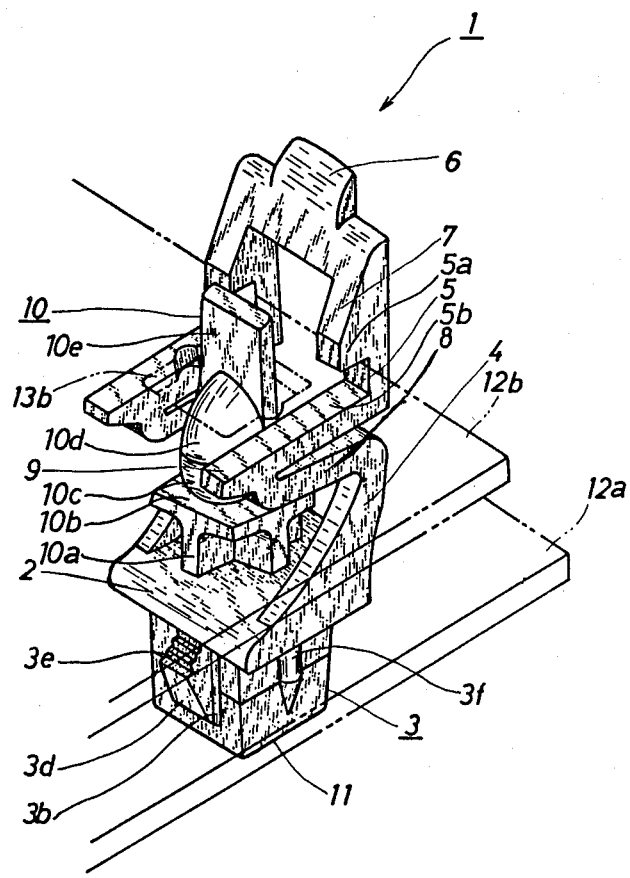
FIG. 1 is a perspective view of the first embodiment.

One embodiment of the board spacer 1, shown in FIG. 1, includes a base 2 with an anchor 3 projecting below to secure a first board 12a to the bottom of the base 2. Two struts 4 rise from the right and left sides of the base 2. Each strut 4 has a spring bar 8. A latch 5 for securing another board 12b spans the spring bars 8. The spacer 1 secures the boards 12a & 12b a fixed distance apart.

The latch 5 has a handle 6 for easier use. A sloping face 7 on the front of the latch 5 facilitates insertion of the board 12b. The spring bars 8 have tips 9 opposite the latch 5 that push the board 12b up when the latch 5 is pulled back to disengage the board. The latch 5 also has a hook 5a and brackets 5b for holding the upper board 12b in place between them (5a & 5b).

Figure 2A:
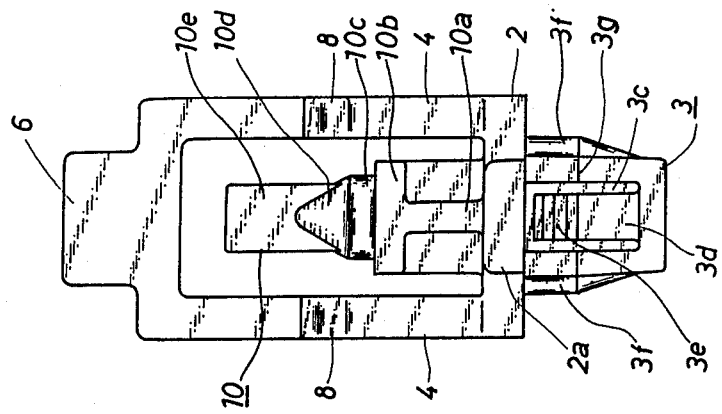
FIG. 2A is a front view of the first embodiment.
Figure 2B:
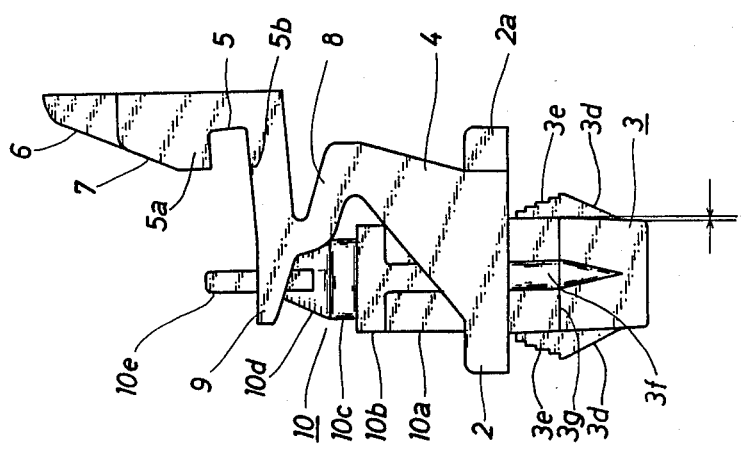
FIG. 2B is a right side view of the first embodiment.
Figure 2C:
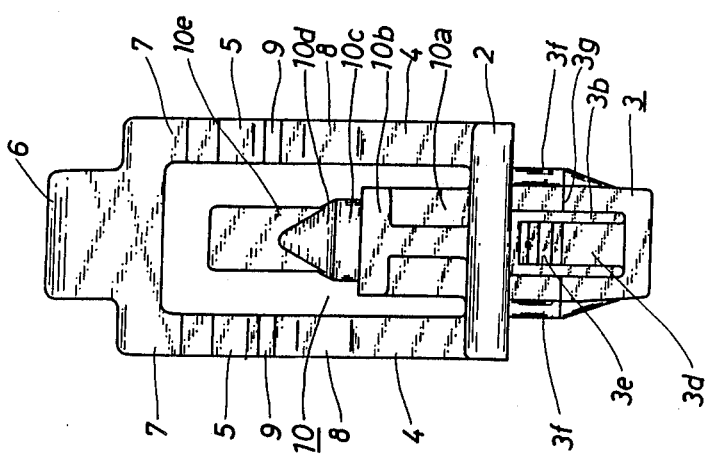
FIG. 2C is a rear view of the first embodiment.
Figure 2F:
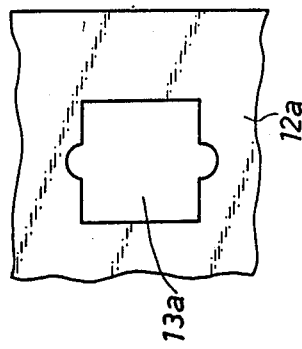
FIG. 2F is a top plan view of the mounting aperture on a board.
Figure 2E:
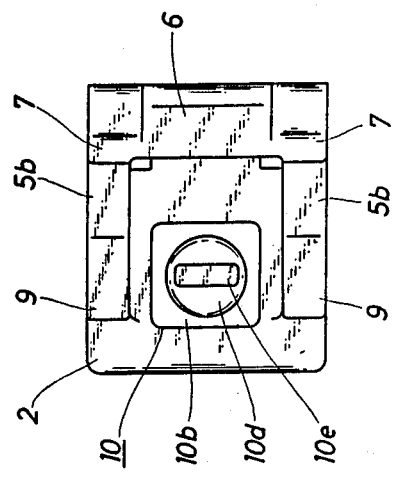
FIG. 2E is a top plan view of the first embodiment.
Figure 2D:
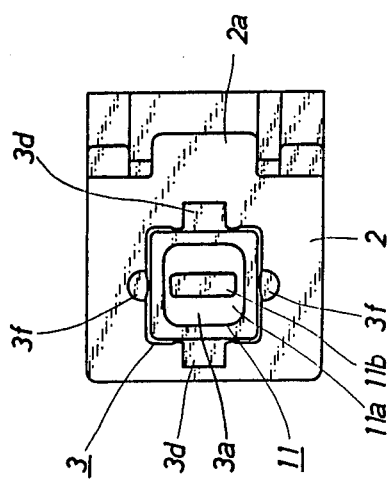
FIG. 2D is a bottom view of the first embodiment.
Figure 3A:
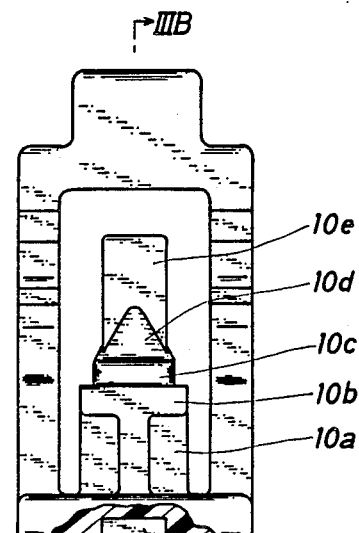
FIG. 3A is a front partial cross section of the first embodiment along line IIIA—IIIA in FIG. 3B.
Figure 3B:
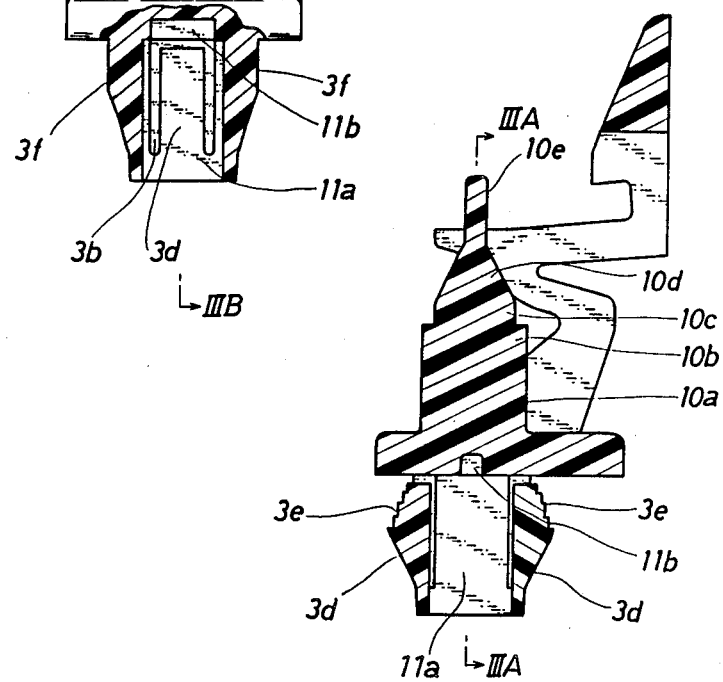
FIG. 3B is a side cross section of the first embodiment along line IIIB—IIIB in FIG. 3A.

A post 10 rises from the upper surface of the base 2. The post 10 is collinear with the anchor 3 on opposing sides of the base 2. The anchor 3 has a shank 11 with a shaft 11a to accommodate the post 10 of another spacer 1. This permits the spacers 1 to be stacked while spacing boards 12a & 12b. As shown in FIGS. 2B-D, the base 2 has a brace 2a in back. This brace 2a increases the contact area between the base 2 and the board 12a. The increase in contact area and the bracing to the rear both increase the stability of the spacer 1 and prevent rocking.

On the bottom of the shank 11 is an entrance 3a for the shaft 11a. Two inverted-U-shaped slots 3b & 3c (front and back respectively) delimit the anchor arms 3d. The anchor arms 3d attach to the shank 11 at their bottom edges leaving them free to bend when inserted through a mounting hole 13a shown in FIG. 2F. The anchor arms 3d have barbs 3e on their upper faces for gripping the board 12a below the base 2.

The shank 11 has guides 3f on its right and left sides. The lower end of each guide 3f is tapered to ease insertion. The shaft 11 tapers toward its bottom starting at a break 3g, as shown in FIG. 2B; this also eases insertion of the shank 11 into the mounting hole 13a. The guides 3f help align the spacer 1 for insertion into the mounting hole 13a.

The post 10 has a pedestal 10a rising from the upper surface of the base 2 with a platform 10b. On the platform 10b is a cylindrical plinth 10c supporting a cone 10d. A peg 10e rises from the cone 10d and extends past the spring bars 8 so it may be used as a guide during coupling and uncoupling.

The shaft 11a inside the shank 11 extends the entire height of the shank 11. At the top of the shaft 11a, recessed into the underside of the base 2, is a notch 11b for retaining the peg 10e of another spacer 1 of this design inserted into the shaft 11a from below. To increase stability, the diameter of the plinth 10c and the width of the shaft 11a are the same, so the coupling between two spacers 1 is snug.

Figure 4:
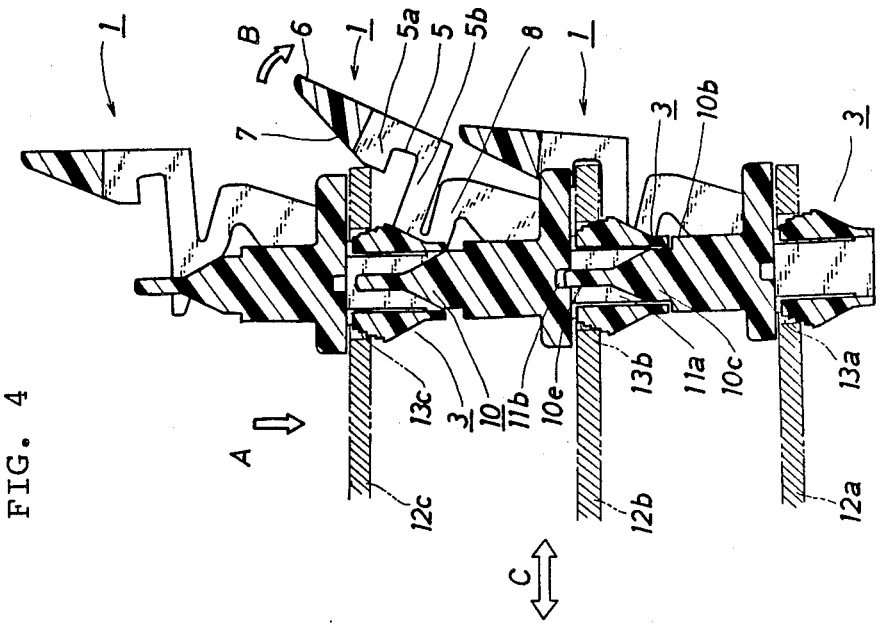
FIG. 4 is a side cross section like FIG. 3B of three board mounts of the first embodiment where their latches are, from the top, unengaged, engaging, and engaged, respectively.
Figure 7:
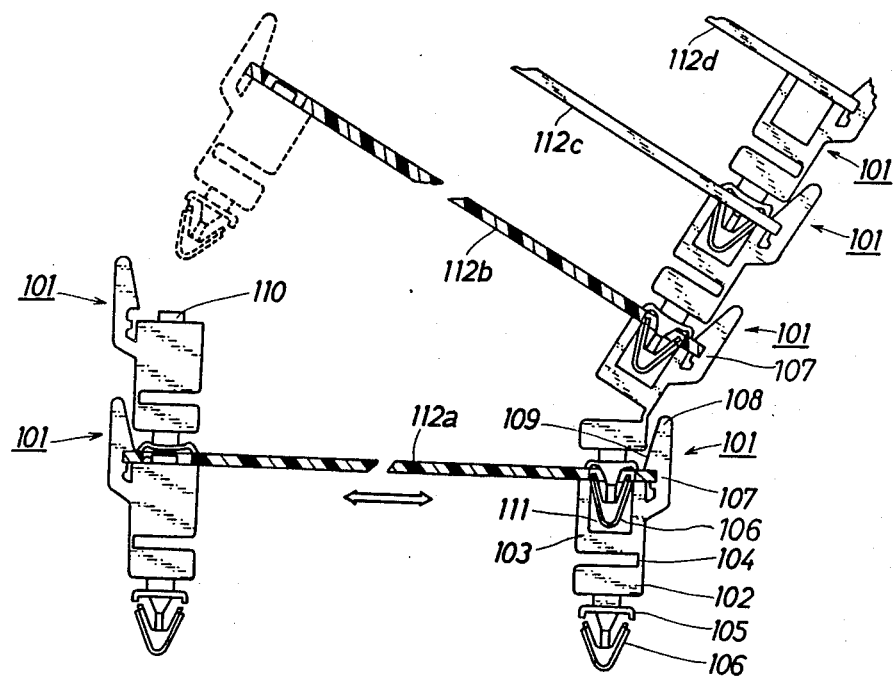
FIG. 7 is a side view of prior-art devices in use.

As shown in FIG. 4, each of the boards 12a, 12b & 12c has a mounting hole (13a, 13b & 13c respectively) into which an anchor 3 may be inserted. Next, an upper board 12c is pushed down (direction A) onto the post 10 of the spacer 1 on the lower board 12b. The coupling of the upper shaft 11a and lower post 10 horizontally secures the upper board 12c. Simultaneously, an edge of the upper board 12c slides down the sloped face 7. The spring bars 8 allow the latch 5 to bend back (direction B) until the board 12c slides past the hooks 5a and locks into place. The notch 11b retains the peg 10e. The plinth 10c tangentially touches the shaft 11a at four points, so horizontal forces (direction C) will not rock the boards 12a, 12b & 12c.

Figure 5:
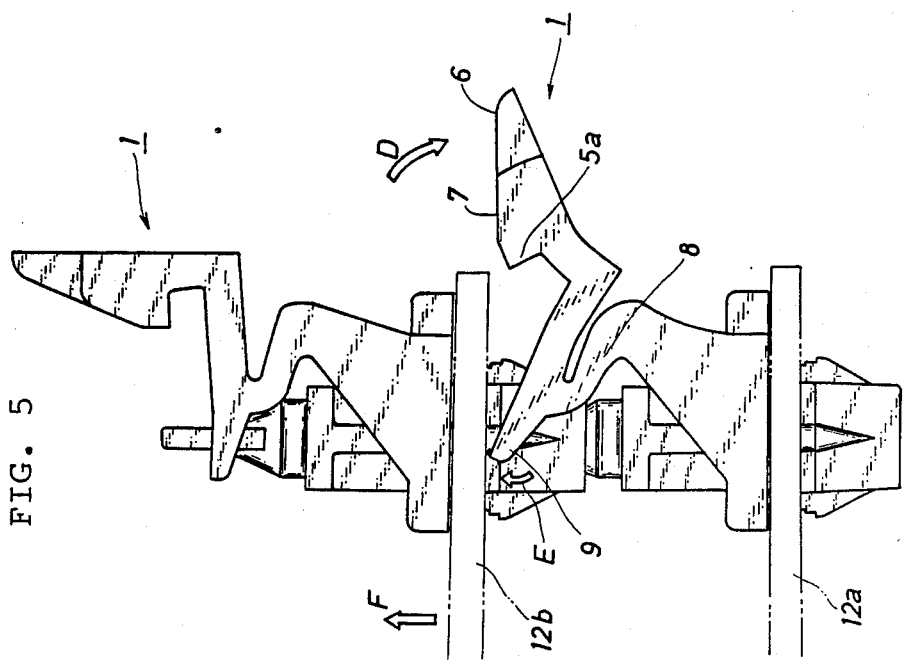
FIG. 5 is a side view of two board mounts of the first embodiment where their latches are, from the top, unengaged and disengaging, and respectively.

As shown in FIG. 5, to remove a board 12b, pull back (direction D) the handle 6 of the spacer 1 under the board 12b to be detached. The spring bars 8 bend back freeing the board 12b from the hooks 5a. Simultaneously, the tips 9 lever the board 12b upward (direction E), so the board 12b can be lifted out (direction F).

FIGS. 6A and 6B show a second embodiment of this invention. A board spacer 20 of this embodiment is similar to the board spacer 1 in the first embodiment. One difference lies in the position and structure of the peg and notch. In this second embodiment, the peg 11c descends through the shaft 11a and below the shank 11. The top of the post 10 is removed down to the plinth 10c. A notch 10f in the plinth 10c accommodates the peg 11c, so the spacers 20 stack without rocking.

Many variations and modifications of the present invention are possible. For example, the peg 10e in the first embodiment might not project above the bracket 5b, or the peg 11c in the second embodiment might not project below the bottom of the anchor 3. The shaft 11a might be cylindrical like the plinth 10c, or the plinth 10c might be square like the shaft 11a. Either way, the interlocking shapes of the shaft and plinth provide a snugger fit, and thus increase stability, thus reducing rocking.

In the second embodiment, the shank 11 might be solid with the peg 11c protruding below so that coupling between two stacked spacers 20 uses only the peg 11c and the notch 10f. Moreover, a coil spring could replace the spring bar 8.

These embodiments of the present device are just a few examples of the claimed invention. The claims are not restricted to these examples. This invention embraces all variations and modifications within the scope of the claims.

I claim:

1. A board spacer for spacing a lower board and an upper board a fixed distance apart, comprising:
   a base;
   an anchor under the base for securing the lower board;
   at least one strut on the upper surface of the base;
   a spring bar on the upper end of the strut;
   a latch on the spring bar for engaging with and securing the upper board;
   a handle on the latch for manipulating the latch;
   a sloped face on the latch;
   a tip on the spring bar opposite the latch for facilitating removal of the upper board;
   a peg at one side of the base; and
   a notch at the side of the base opposite the peg for coupling with the peg of another such board spacer so such spacers can be used to stack several spaced boards.

2. A board spacer, as in claim 1, where
   the peg descends from the anchor; and
   the notch is on the upper surface of the base.

3. A board spacer, as in claim 1, where:
   the anchor has a shaft; and
   the base has a post that engages with the shaft.

4. A board spacer, as in claim 3, where a portion of the post and the hole formed by the shaft are identical interlocking polygons.

5. A board spacer, as in claim 3, where
   the peg descends from the anchor; and
   the notch is on the upper surface of the post.

* * * * *